(12) United States Patent
Kim et al.

(10) Patent No.: US 9,269,867 B2
(45) Date of Patent: Feb. 23, 2016

(54) LIGHT EMITTING DEVICE AND METHOD OF FABRICATING THE SAME

(71) Applicant: SEOUL VIOSYS CO., LTD., Ansan-si (KR)

(72) Inventors: Ye Seul Kim, Ansan-si (KR); Shin Hyoung Kim, Ansan-si (KR); Kyoung Wan Kim, Ansan-si (KR); Yeo Jin Yoon, Ansan-si (KR); Jun Woong Lee, Ansan-si (KR); Tae Gyun Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 2 days.

(21) Appl. No.: 14/076,626

(22) Filed: Nov. 11, 2013

(65) Prior Publication Data
US 2014/0131731 A1    May 15, 2014

(30) Foreign Application Priority Data
Nov. 9, 2012  (KR) .......................... 10-2012-0126903

(51) Int. Cl.
| | | |
|---|---|---|
| *H01L 33/32* | (2010.01) | |
| *H01L 33/14* | (2010.01) | |
| *H01L 33/22* | (2010.01) | |
| *H01L 33/38* | (2010.01) | |

(52) U.S. Cl.
CPC ............... *H01L 33/32* (2013.01); *H01L 33/14* (2013.01); *H01L 33/22* (2013.01); *H01L 33/382* (2013.01); *H01L 2933/0016* (2013.01)

(58) Field of Classification Search
CPC ......... H01L 33/20; H01L 33/22; H01L 33/32; H01L 33/36; H01L 33/38; H01L 33/382; H01L 33/385; H01L 33/14; H01L 2933/0016
See application file for complete search history.

(56) References Cited

U.S. PATENT DOCUMENTS

| | | | |
|---|---|---|---|
| 2005/0082562 A1 | 4/2005 | Ou et al. | |
| 2005/0224823 A1 | 10/2005 | Zhao et al. | |
| 2006/0054907 A1* | 3/2006 | Lai ................................ | 257/96 |

(Continued)

FOREIGN PATENT DOCUMENTS

| | | |
|---|---|---|
| EP | 1329961 | 7/2003 |
| EP | 1848043 | 10/2007 |

OTHER PUBLICATIONS

Extended European Search Report issued on Dec. 18, 2015, in European Patent Application No. 13192259.3.

*Primary Examiner* — Jae Lee
*Assistant Examiner* — Mohammed R Alam
(74) *Attorney, Agent, or Firm* — H.C. Park & Associates, PLC

(57) ABSTRACT

A light-emitting device according to an exemplary embodiment of the present invention includes a first conductivity-type semiconductor layer disposed on a substrate; an active layer disposed on the first conductivity-type semiconductor layer; a second conductivity-type semiconductor layer disposed on the active layer; and an irregular convex-concave pattern disposed on a surface of the first conductivity-type semiconductor layer. The irregular convex-concave pattern includes convex portions and concave portions, and the convex portions have irregular heights and the concave portions have irregular depths. The first conductivity-type semiconductor layer including the irregular convex-concave pattern is exposed from the active layer and the second conductivity-type semiconductor layer.

14 Claims, 11 Drawing Sheets

(56) References Cited

U.S. PATENT DOCUMENTS

| | | | |
|---|---|---|---|
| 2007/0272937 A1* | 11/2007 | Sakamoto et al. | 257/98 |
| 2010/0006884 A1* | 1/2010 | Ou et al. | 257/98 |
| 2010/0243987 A1 | 9/2010 | Liu et al. | |
| 2011/0156070 A1* | 6/2011 | Yoon et al. | 257/98 |
| 2011/0204403 A1* | 8/2011 | Kim et al. | 257/98 |
| 2011/0220931 A1* | 9/2011 | Kojima | 257/98 |
| 2012/0025246 A1 | 2/2012 | Kim et al. | |
| 2012/0305942 A1* | 12/2012 | Lo et al. | 257/77 |

* cited by examiner

LIGHT EMITTING DEVICE AND METHOD OF FABRICATING THE SAME

CROSS-REFERENCE TO RELATED APPLICATION

This application claims priority from and the benefit of Korean Patent Application No. 10-2012-0126903, filed on Nov. 9, 2012, which is hereby incorporated by reference for all purposes as if fully set forth herein.

BACKGROUND

1. Field

The present invention relates to a light emitting device and, more particularly, to a light emitting device having improved current dispersing performance and luminous efficacy, and a method of fabricating the same.

2. Discussion of the Background

Generally, a light emitting device includes an N—GaN layer, an active layer and a P—GaN layer, which are sequentially formed on a substrate such as a sapphire substrate, a p-electrode formed on the P—GaN layer, and an n-electrode formed on the N—GaN layer.

The n-electrode is formed on a portion of the N—GaN layer, which is exposed by partially etching the active layer and the P—GaN layer.

In addition, a transparent electrode layer is formed on the P—GaN layer. The transparent electrode layer is formed to achieve uniform spreading of electric current on the P—GaN layer having very high resistance.

The light emitting device is operated by connecting an external power source to the p-electrode and the n-electrode, such that light is generated in the active layer. Although some of the light generated in the active layer is emitted outside, a substantial amount of the light may be absorbed by the sapphire substrate and semiconductor layers, causing optical loss. In particular, a high index of refraction of the GaN layer may cause total internal reflection at a surface of the GaN layer, causing loss of light inside the GaN layer instead of allowing emission of light to the outside.

Recently, a light emitting device capable of being operated by a high electric current of 1 A or more has been developed. Upon operation of the light emitting device under high current conditions, the light emitting device may suffer from severe current crowding. Therefore, there is a need for a light emitting device having improved current dispersing performance.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a light emitting device having improved current dispersing performance and a method of fabricating the same.

Exemplary embodiments of the present invention also provide a light emitting device having improved luminous efficacy and a method of fabricating the same.

Exemplary embodiments of the present invention also provide a light emitting device having not only improved luminous efficacy but also improved current dispersing performance, and a method of fabricating the same.

Additional features of the invention will be set forth in the description which follows, and in part will be apparent from the description, or may be learned by practice of the invention.

In accordance an exemplary embodiment of the present invention, a light emitting device includes a first conductivity-type semiconductor layer disposed on a substrate; an active layer disposed on the first conductivity-type semiconductor layer; a second conductivity-type semiconductor layer disposed on the active layer; and an irregular convex-concave pattern disposed on a surface of the first conductivity-type semiconductor layer. The irregular convex-concave pattern includes convex portions and concave portions, and the convex portions have irregular heights and the concave portions have irregular depths. The first conductivity-type semiconductor layer including the irregular convex-concave pattern is exposed from the active layer and the second conductivity-type semiconductor layer.

In accordance with an exemplary embodiment of the present invention, a method of forming a light emitting device includes: sequentially growing a first conductivity-type semiconductor layer, an active layer, and a second conductivity-type semiconductor layer on a substrate; exposing the first conductivity-type semiconductor layer by partially removing the active layer and the second conductivity-type semiconductor layer through photolithography and etching; forming a protective layer and a mask metal layer on the active layer and the second conductivity-type semiconductor layer and on the exposed the first conductivity-type semiconductor layer; forming a mask in a structure of agglomerated particles by heating the mask metal layer to a first temperature; forming an irregular convex-concave pattern on the exposed first conductive type semiconductor layer by forming a photosensitive pattern on the mask; and removing the protective layer and the mask through etching, wherein the irregular convex-concave pattern includes convex portions and concave portions, and the convex portions have irregular heights and the concave portions have irregular depths.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
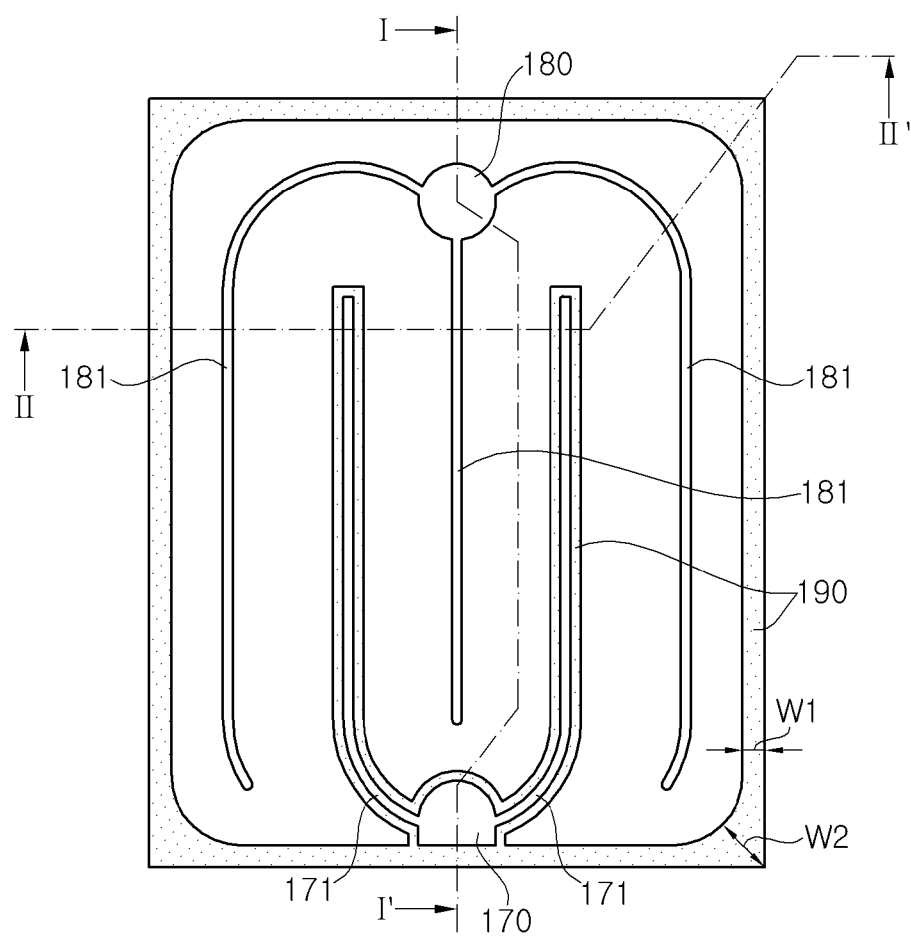
FIG. 1 is a schematic plan view of a light emitting device according to a first exemplary embodiment of the present invention.

Exemplary embodiments of the present invention will be described in more detail with reference to the accompanying drawings. It should be understood that the following embodiments are given by way of illustration only to provide thorough understanding of the invention to those skilled in the art. Therefore, the present invention is not limited to the following exemplary embodiments and may be embodied in different ways. Further, like components will be denoted by like reference numerals throughout the specification, and the widths, lengths, and thicknesses of certain elements, layers or features may be exaggerated for clarity.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 2:
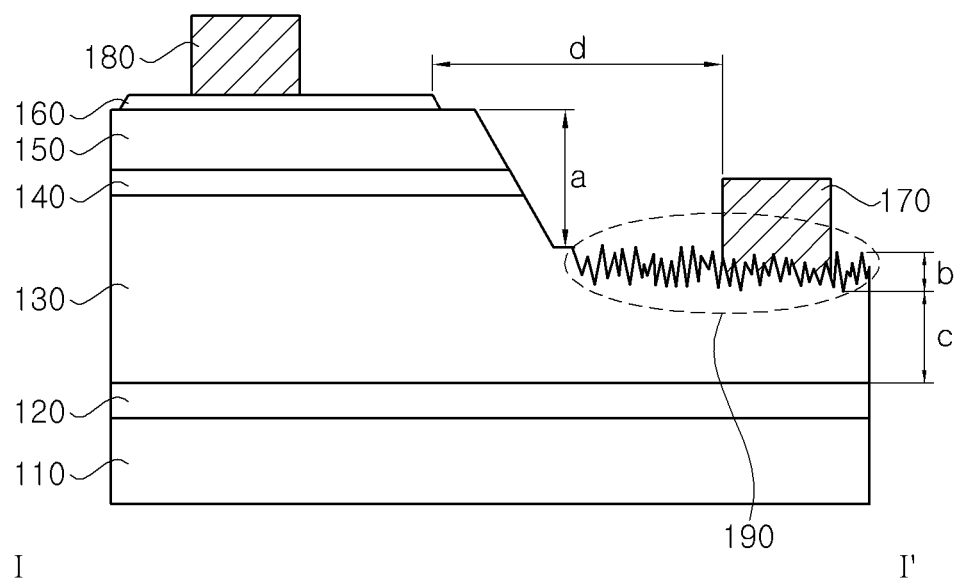
FIG. 2 is a sectional view of the light emitting device taken along line I-I' of FIG. 1.

FIG. 1 is a schematic plan view of a light emitting device according to a first exemplary embodiment of the invention; FIG. 2 is a sectional view of the light emitting device taken along line I-I' of FIG. 1; and FIG. 3 is a sectional view of the light emitting device taken along line II-II' of FIG. 1.

Figure 3:
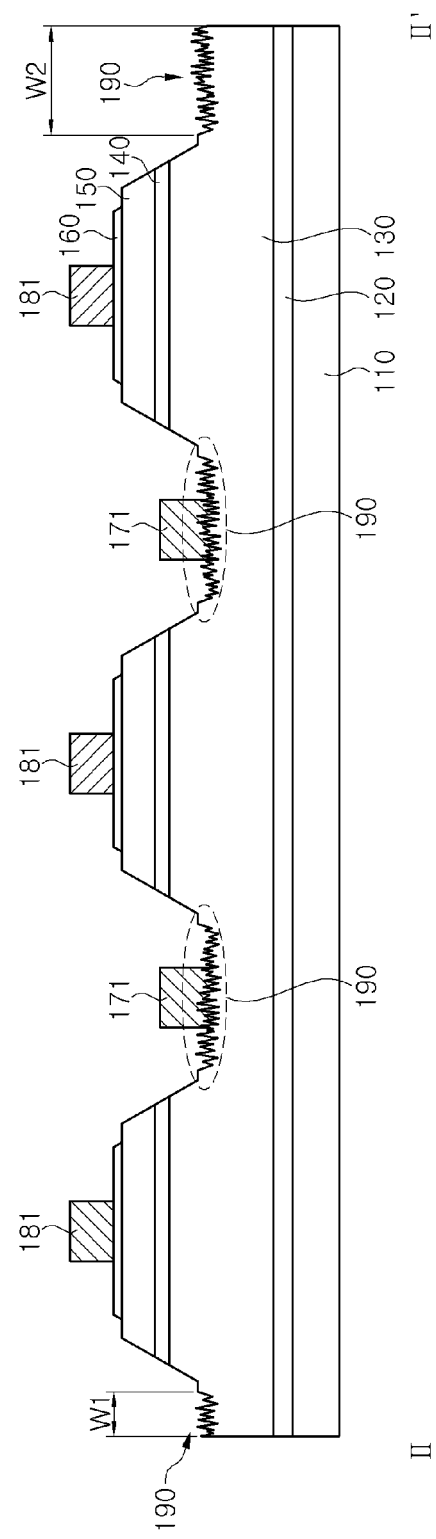
FIG. 3 is a sectional view of the light emitting device taken along line II-II' of FIG. 1.

Referring to FIG. 1 to FIG. 3, the light emitting device according to the first exemplary embodiment includes a substrate 110, a buffer layer 120, a first conductive type semiconductor layer 130, an active layer 140, a second conductive type semiconductor layer 150, a transparent electrode layer 160, a first electrode pad 170, a second electrode pad 180, first electrode legs 171, and second electrode legs 181.

The substrate 110 may be a growth substrate, such as a sapphire substrate, spinel substrate, gallium nitride substrate, silicon carbide substrate or silicon substrate, which can be used for growth of gallium nitride compound semiconductor layers, without being limited thereto.

The active layer 140 and the first and second conductive type semiconductor layers 130, 150 may be formed of a gallium nitride compound semiconductor material, for example, (Al, In, Ga)N. A composition of the active layer 140 is determined such that light having a desired wavelength, for example UV light or visible light, can be emitted therefrom. The active layer 140 and first and second conductive type semiconductor layers 130, 150 may be formed by MOCVD or MBE.

The first conductive type semiconductor layer 130 is an n-type nitride semiconductor layer, and the second conductive type semiconductor layer 150 is a p-type nitride semiconductor layer. Each of the first and second conductive type semiconductor layers 130, 150 may include a single layer or multiple layers.

The transparent electrode layer 160 may be formed of a transparent oxide such as ITO, or Ni/Au, and is in ohmic contact with the second conductive type semiconductor layer 150.

The first electrode pad 170 and the first electrode legs 171 are formed on the first conductive type semiconductor layer 130, and the second electrode pad 180 and the second electrode legs 181 are formed on the second conductive type semiconductor layer 150.

The first electrode pad 170 and the first electrode legs 171 may be formed on a region of the first conductive type semiconductor layer 130, which is exposed by partially etching the second conductive type semiconductor layer 150 and the active layer 140.

The first electrode legs 171 are bifurcated from the first electrode pad 170 and the second electrode legs 181 extend from the second electrode pad 180.

The first and second electrode legs 171, 181 are alternately arranged with reference to a horizontal line of the light emitting device, and are formed at constant intervals.

The first electrode legs 171 are bent in an edge region of the light emitting device and extend in a first direction.

The second electrode legs 181 are bent in the edge region of the light emitting device and extend in an opposite direction to the first direction to be parallel to the first electrode legs 171.

The first conductive type semiconductor layer 130 has an irregular convex-concave pattern 190 formed on a surface thereof.

The irregular convex-concave pattern 190 may include convex portions and concave portions, and may have a protruding structure, for example, a conical shape, which protrudes in an upper direction of the first conductive type semiconductor layer 130.

To form a mesa area, the irregular convex-concave pattern 190 is formed on the region of the first conductive type semiconductor layer 130, which is exposed by partially etching the second conductive type semiconductor layer 150 and the active layer 140. The irregular convex-concave pattern 190 enhances light extraction efficiency by refracting light entering the exposed surface of the first conductive type semiconductor layer 130.

Here, the mesa area includes a slanted plane having a predetermined inclination. The slanted plane has an inclined angle of 20 to 50° with respect to the exposed surface of the first conductive type semiconductor layer 130.

Further, the irregular convex-concave pattern 190 can solve the problem of current crowding in a region to which the first electrode pad 170 and the active layer 140 are closest. In other words, the convex portions and concave portions of the irregular convex-concave pattern 190 prevent carriers (electrons) from moving from the first electrode pad 170 to the active layer 140 along the surface of the first conductive type semiconductor layer 130, whereby electric current can be distributed over a wide area of the first conductive type semiconductor layer 130.

The irregular convex-concave pattern 190 may be formed over the exposed upper surface of the first conductive type semiconductor layer 130. In addition, the irregular convex-concave pattern 190 may be formed between the first conductive type semiconductor layer 130 and the first electrode pad 170, and between the first conductive type semiconductor layer 130 and the first electrode legs 171.

As shown, the irregular convex-concave pattern 190 may be formed in the edge region of the light emitting device. In the edge region of the light emitting device where electrons and holes have low mobility, the first conductive type semiconductor layer 130 is exposed by etching. In other words, in the edge region of the light emitting device, the first conductive type semiconductor layer 130 is exposed by etching the second conductive type semiconductor layer 150 and the active layer 140 for extraction of light. The irregular convex-concave pattern 190 may be formed on the exposed surface of the first conductive type semiconductor layer 130 corresponding to the edge region of the light emitting device.

In the first conductive type semiconductor layer 130 exposed corresponding to the edge region of the light emitting device, a corner region may have a wider width (W2) than a width (W1) of a lateral region excluding the corner region. For example, the second electrode legs 181 have a round shape in the corner region of the light emitting device in order to maintain a constant lateral distance to the first electrode legs 171. In the edge region of the light emitting device, the corner region of the light emitting device may have a greater etching margin than a lateral region of the light emitting device due to the round shape of the second electrode legs 181. The first conductive type semiconductor layer 130 exposed in the corner region of the light emitting device has an exposed structure corresponding to the shape of the second electrode legs 181 in the corner region of the second electrode legs 181. In this way, in the edge region of the light emitting device, the light emitting device may maximize extraction of light by adjusting the width (W2) of the corner region according to the structure of the second electrode legs 181.

In this invention, the mesa area has a lateral height (a), which is greater than a total height of the active layer 140 and the second conductive type semiconductor layer 150.

The lateral distance (d) between the first electrode pad 170 and the transparent conductive layer 160 is closely related to current dispersing performance. In present exemplary embodiment, the distance (d) between the first electrode pad 170 and the transparent conductive layer 160 is at least 5 μm or more. Although an upper limit of the lateral distance is not particularly limited, the lateral distance (d) may have an upper limit of less than 50 μm in order to prevent reduction in luminous area.

The irregular convex-concave pattern 190 has a height (b), which is lower than a height (c) of the first conductive type semiconductor layer 130 where the irregular convex-concave pattern 190 is not formed. That is, in the exposed region of the first conductive type semiconductor layer 130, the region of the first conductive type semiconductor layer 130, on which the irregular convex-concave pattern 190 is formed, has a smaller thickness than a region of the first conductive type semiconductor layer 130 under the irregular convex-concave pattern 190.

Figure 4A:
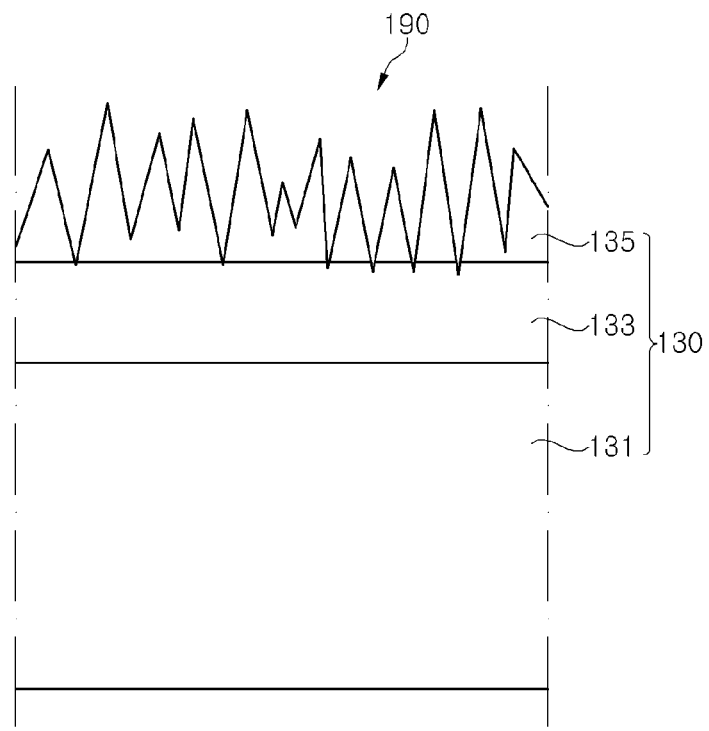
FIG. 4a and FIG. 4b are sectional views of a first conductive type semiconductor layer shown in FIG. 1, illustrating an irregular convex-concave pattern formed thereon.
Figure 4B:
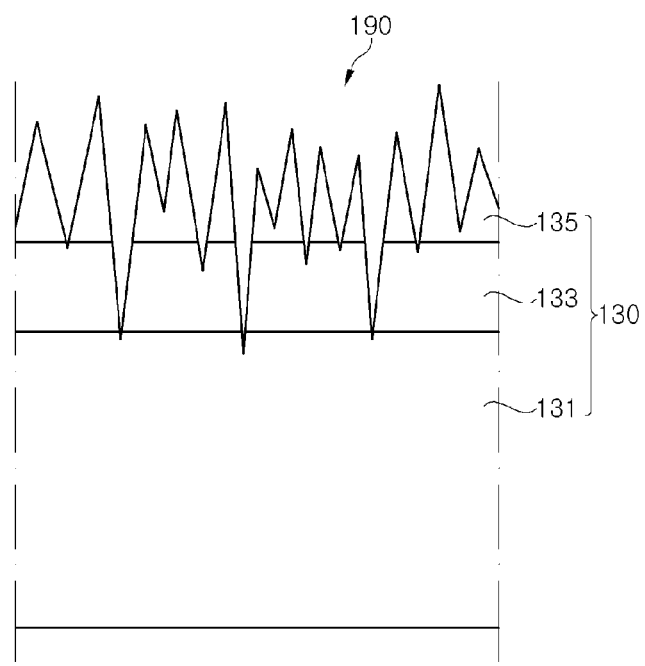

The irregular convex-concave pattern 190 may have a height (b) of 160 nm or more for extraction of light. Referring to FIGS. 4a and 4b, when the irregular convex-concave pattern 190 reaches a low-density doped N—GaN layer, the irregular convex-concave pattern 190 may have a height of less than 3 μm.

FIG. 4a and FIG. 4b are sectional views of the first conductive type semiconductor layer on which the irregular convex-concave pattern of FIG. 1 is formed.

Referring to FIG. 4a, the irregular convex-concave pattern 190 is formed on an upper side of the first conductive type semiconductor layer 130, and may include a plurality of layers having different doping densities.

In this embodiment, the first conductive type semiconductor layer 130 includes n-type nitride semiconductor layers, which include a high-density doped first N—GaN layer 131, a low-density doped second N—GaN layer 133, and a high-density doped third N—GaN layer 135. Here, high-density doping and low-density doping indicate relative doping densities of the first and third N—GaN layers 131, 135 with respect to the second N—GaN layer 133, instead of absolute doping densities. In this regard, when N-type impurities are doped in an amount of 5 E17/cm$^3$ or more, this can be considered high-density doping, and when the N-type impurities are doped in an amount of 5 E17/cm$^3$ or less or when the impurities are not doped, this can be considered low-density doping.

The first N—GaN layer 131 includes a high doping density of impurities.

The second N—GaN layer 133 includes a low doping density of impurities.

The third N—GaN layer 135 includes a high doping density of impurities for ohmic contact with the electrode pad.

Namely, the first and third N—GaN layers 131, 135 include high doping densities of impurities to have lower resistance than the second N—GaN layer 133, thereby allowing easy flow of electric current therethrough.

The irregular convex-concave pattern 190 has a structure wherein the convex portions having a peak shape and the concave portions having a valley shape are irregularly formed. That is, in the irregular convex-concave pattern 190, the convex portions have irregular heights and the concave portions have irregular depths.

The irregular convex-concave pattern 190 may be formed on the third N—GaN layer 135, in which the concave portions reach the second N—GaN layer 133. That is, the concave portions may have a depth extending to the second N—GaN layer 133, thereby suppressing current flow through the third N—GaN layer 135. In addition, the second N—GaN layer 133 has a low doping density, thereby allowing current dispersion by inducing electric current to flow through the first N—GaN layer 131. In the present exemplary embodiment, the first conductive type semiconductor layer 130 is formed with the irregular convex-concave pattern 190 on the third N—GaN layer 135, which has a high doping density and is provided for ohmic contact with the electrode pad, and allows light entering the irregular convex-concave pattern 190 within a predetermined range of incident angles to be spread therethrough, thereby improving light extraction efficiency.

Further, in the irregular convex-concave pattern 190, the concave portions extend to the second N—GaN layer 133 having a low doping density and suppress concentration of current flow on the third N—GaN layer 135, thereby allowing electric current to be dispersed to the first N—GaN layer 131 having a high doping density. Accordingly, the light emitting device according to the present exemplary embodiment may enhance current dispersing performance.

Referring to FIG. 4b, the first conductive type semiconductor layer 130 according to this embodiment has the same structure as that shown in FIG. 4a except for the depth of the concave portions in the irregular convex-concave pattern 190. Thus, detailed descriptions of the respective components will be omitted.

Referring to FIG. 4b, in the first conductive type semiconductor layer 130, the concave portions of the irregular convex-concave pattern 190 extend from the third N—GaN layer 135 to the first N—GaN layer 131. The concave portions of the irregular convex-concave pattern 190 extend to a portion of the first N—GaN layer 131. That is, the concave portions of the irregular convex-concave pattern 190 have a depth extending from the third N—GaN layer 135 to the first N—GaN layer 131. The concave portions of the irregular convex-concave pattern 190 may have a depth extending to an upper portion of the first N—GaN layer 131 for efficient current distribution.

Accordingly, the irregular convex-concave pattern 190 can improve light extraction efficiency by spreading light entering within a predetermined range of incident angles, and the concave portions of the irregular convex-concave pattern extend to the upper portion of the first N—GaN layer 131 such that electric current can be dispersed through the first N—GaN layer 131, thereby maximizing current dispersing performance.

FIGS. 5a to 5g are sectional views illustrating a method of fabricating the light emitting device according to the first exemplary embodiment of the present invention.

Figure 5A:
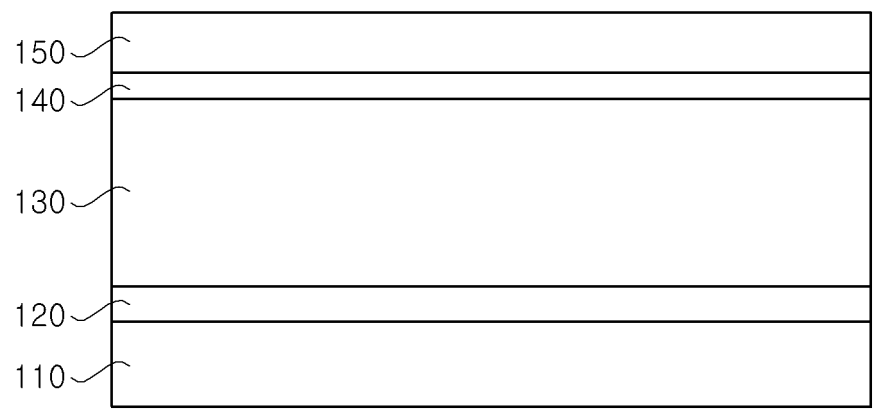
FIGS. 5a to 5g are sectional views illustrating a method of fabricating the light emitting device according to the first exemplary embodiment.

Referring to FIG. 5a, a buffer layer 120, a first conductive type semiconductor layer 130, an active layer 140 and a second conductive type semiconductor layer 150 are sequentially formed on a substrate 110.

The substrate 110 may be at least one selected from among a sapphire substrate, spinel substrate, Si substrate, SiC substrate, ZnO substrate, GaAs substrate, and GaN substrate. In this embodiment, a sapphire substrate is used as the substrate 120.

The buffer layer 120, the active layer 140, and the first and second conductive type semiconductor layers 130, 150 may be formed by various deposition and growth processes, such as Metal Organic Chemical Vapor Deposition (MOCVD), Molecular Beam Epitaxy (MBE), Hydride Vapor Phase Epitaxy (HVPE), and the like.

The first conductive type semiconductor layer 130 may be a GaN layer into which N-type impurities are implanted. The second conductive type semiconductor layer 150 may be a GaN layer into which P-type impurities are implanted. The N-type impurities may be Si. The P-type impurities may be Mg. However, it should be understood that the present invention is not limited thereto and various semiconductor material layers may be used.

The active layer 140 may have a multi-quantum well structure in which quantum well layers and barrier layers are alternately formed. The barrier layers and the well layers may be formed of a binary compound such as GaN, InN, AlN, and the like, a tertiary compound, such as $In_xGa_{1-x}N$ (0=x=1), $Al_xGa_{1-x}N$ (0=x=1), and the like, or a quaternary compound, such as $Al_xIn_yGa_{1-x-y}N$ (0=x+y=1) and the like.

Figure 5B:
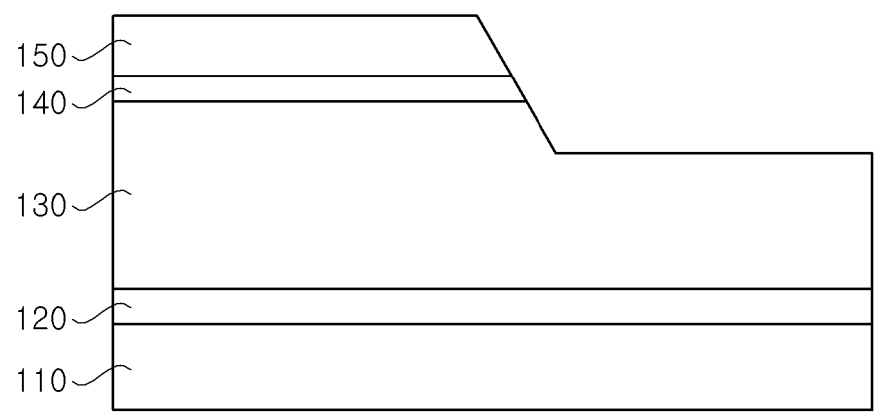

Referring to FIG. 5b, the first conductive type semiconductor layer 130 is partially exposed by a patterning process, for example, photolithography and etching, using masks.

Specifically, in a photolithograph process using a mask, a photosensitive film is deposited onto the second conductive type semiconductor layer 150 and is selectively cured through the mask to form a photosensitive film pattern. The photosensitive film pattern has a structure in which a region of the photosensitive film corresponding to a region of the first conductive type semiconductor layer 130 to be exposed is removed from the photosensitive film. Then, etching is performed using the photosensitive layer pattern as a mask such that the second conductive type semiconductor layer 150 and the active layer 140 are partially removed to expose the first conductive type semiconductor layer 130. Here, etching may be dry etching or wet etching.

Figure 5C:
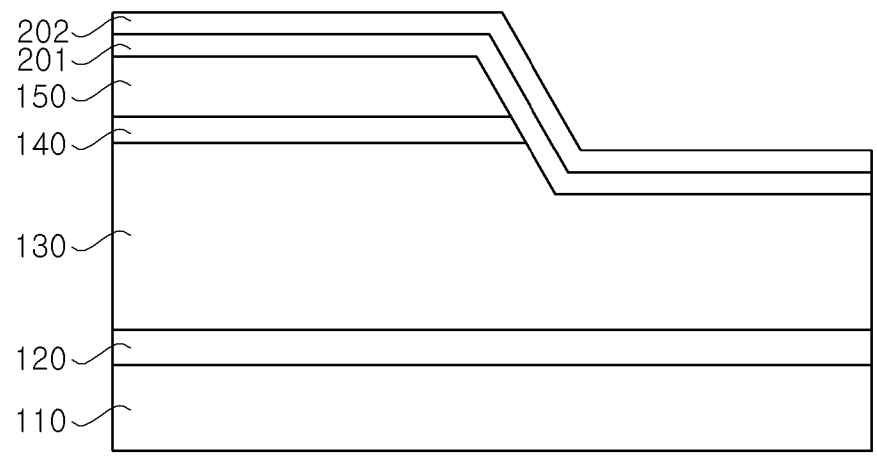

Referring to FIG. 5c, a protective layer 201 is formed on the second conductive type semiconductor layer 150 and on the exposed first conductive type semiconductor layer 130. The protective layer 201 is also formed on a lateral side of the active layer 140 and a lateral side of the second conductive type semiconductor layer 150.

By way of example, the protective layer 201 may be formed of $SiO_2$ and may have a thickness of 300 Å.

A mask metal layer 202 is formed on the protective layer 201. By way of example, the mask metal layer 202 may be formed of Ni. In addition, the mask metal layer 202 may have a thickness of, for example, 100 Å.

The protective layer 201 serves to prevent contamination of the second conductive type semiconductor layer 150 due to diffusion of N to the surface of the second conductive type semiconductor layer 150 upon formation of the mask pattern of the mask metal layer 202.

Figure 5D:
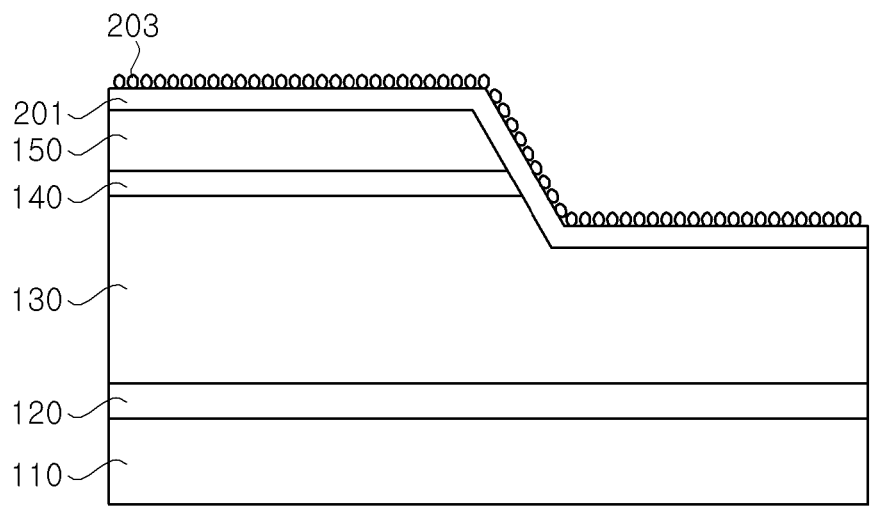

Referring to FIG. 5d, the mask metal layer 202 is heated to a predetermined temperature or more to form a mask 203, which has a structure of agglomerated particles.

Specifically, the mask 203 may be formed using self-assembled characteristics by surface energy of the mask metal layer 202 (see FIG. 5c) and interface energy of a lower layer.

For example, when the mask metal layer 202 (see FIG. 5c) is a Ni layer, the mask 203 may be formed by heating the mask metal layer to a critical point of 400° C.~900° C. to obtain self-assembled characteristics. That is, when the structure of agglomerated particles is formed by heating the mask metal layer 202 (see FIG. 5c) to a critical point (500° C.~600° C.) at which self-assembled characteristics start, it is possible to form a dense and highly concave-convex pattern.

Figure 5E:
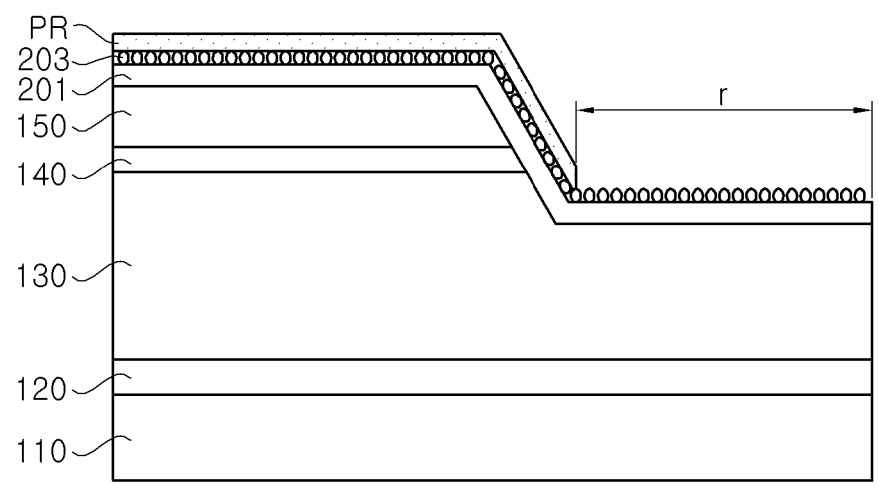
Figure 5F:
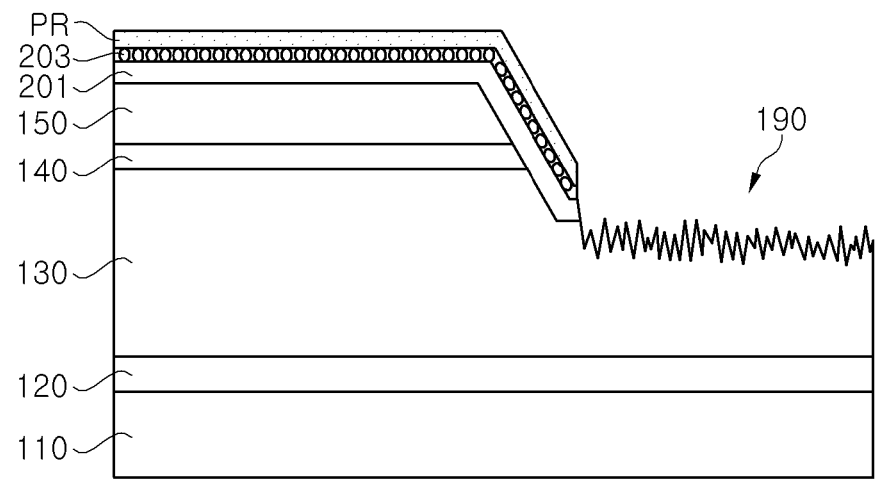

Referring to FIG. 5e and FIG. 5f, a photosensitive film is deposited onto the mask 203, and the second conductive type semiconductor layer 150 and the active layer 140 are partially etched to form a photosensitive pattern PR, through which an upper region (r) of the exposed first conductive type semiconductor layer 130 is exposed.

The photosensitive film pattern (PR) opens the upper region (r) of the exposed first conductive type semiconductor layer 130. In this invention, the mask 203 and the protective layer 201 on the upper region (r) are removed by etching, for example, wet etching or dry etching, and an irregular convex-concave pattern 190 is formed on the first conductive type semiconductor layer 130. Here, in the irregular convex-concave pattern 190, the height of the convex portions and the depth of the concave portions may be varied according to etching conditions.

Figure 5G:
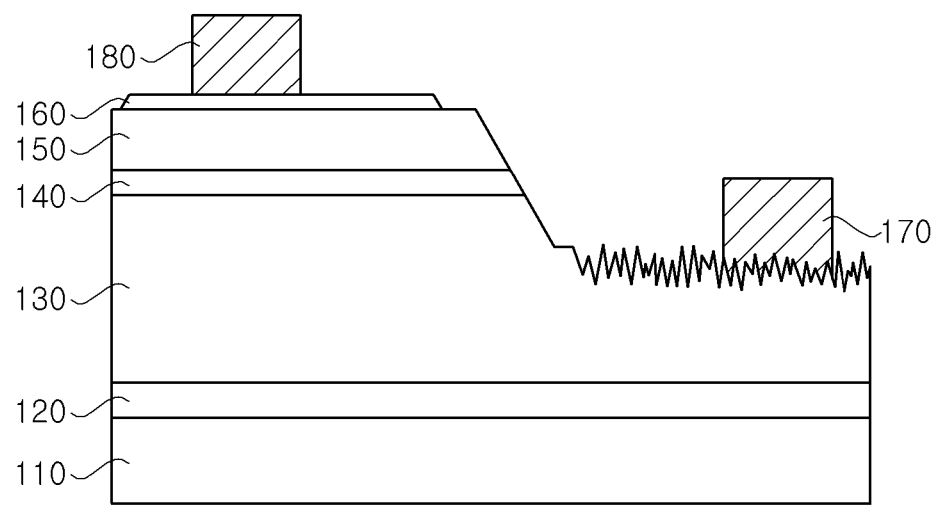

Referring to FIG. 5g, a transparent conductive layer 160 is formed on the second conductive type semiconductor layer 150. The transparent conductive layer 160 may be formed of a transparent metal or transparent conductive oxide. In addition, first and second electrode pads 170, 180 are formed on the transparent conductive layer 160 and the irregular convex-concave pattern 190, respectively. Here, although not shown, upon formation of the first and second electrode pads 170, 180, first electrode legs 171 (see FIG. 1) and second electrode legs 181 (see FIG. 1) may be formed at the same time, as shown in FIG. 1.

Figure 6:
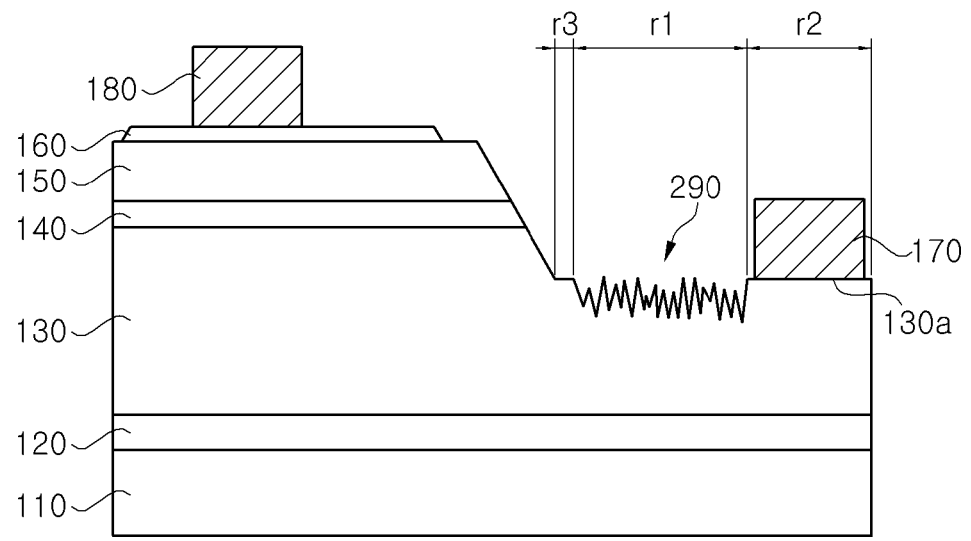
FIG. 6 is a sectional view of a light emitting device according to a second exemplary embodiment of the present invention.
Figure 7:
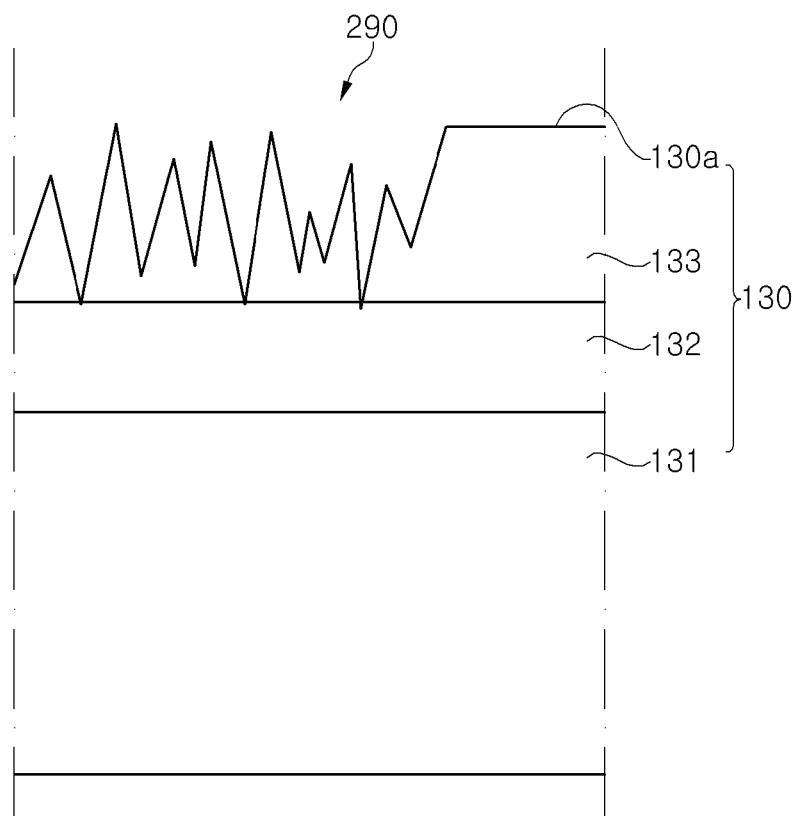
FIG. 7 is a detailed sectional view of a portion of a first conductive type semiconductor layer, on which an irregular convex-concave pattern of FIG. 6 is formed.

FIG. 6 is a sectional view of a light emitting device according to a second embodiment of the invention, and FIG. 7 is a detailed sectional view of a portion of a first conductive type semiconductor layer, on which an irregular convex-concave pattern of FIG. 6 is formed.

Referring to FIGS. 6 and 7, the light emitting device according to the second embodiment includes the same components as those of the light emitting device according to the first embodiment except for a location of an irregular convex-concave pattern 290. Thus, the same components will be denoted by the same reference numerals, and detailed descriptions thereof will be omitted.

The irregular convex-concave pattern 290 is formed on a region of the first conductive type semiconductor layer 130, which is exposed by partially etching the second conductive type semiconductor layer 150 and the active layer 140. A region of the first conductive type semiconductor layer 130, on which the irregular convex-concave pattern 290 is formed, is defined as a first region (r1).

The exposed region of the first conductive type semiconductor layer 130 includes not only the first region (r1) but also a second region (r2) on which a first electrode pad 170 will be formed. A third region (r3) is provided as a process margin for forming a photosensitive film pattern, which will be used to form the irregular convex-concave pattern 290.

The second region (r2) is a region on which the first electrode pad 170 is formed, and a region of the first conductive type semiconductor layer 130 corresponding to the second region (r2) has a flat surface 130a.

In the irregular convex-concave pattern 290, each of the convex portions has one end, which is disposed below the active layer 140 and coplanar with or below the flat surface 130a.

Alternatively, according to a different process sequence (not shown), one end of each of the convex portions of the irregular convex-concave pattern 290 may be disposed below the active layer 140 and above the flat surface 130a.

In the light emitting device according to the second embodiment, the irregular convex-concave pattern 290 is formed only between the mesa area and the first electrode pad 170, thereby further improving electrical properties.

Now, the improved electrical properties of the light emitting device according to the second embodiment will be described with reference to FIG. 8.

Figure 8:
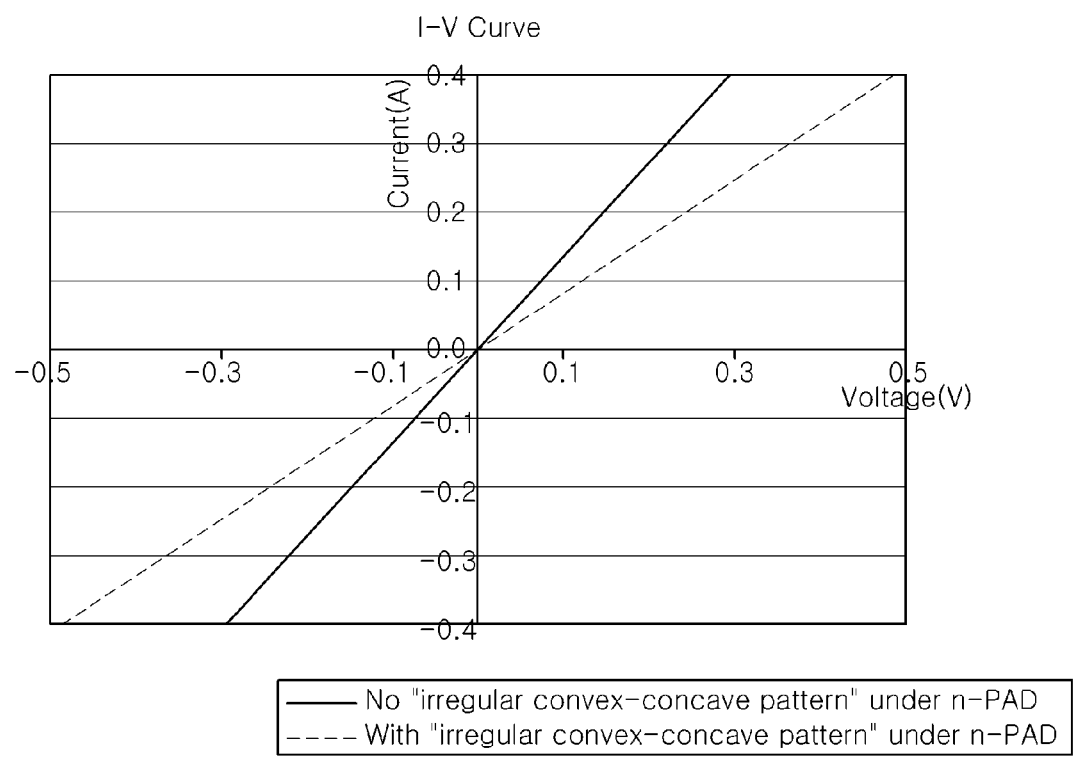
FIG. 8 is a graph depicting electrical properties of the light emitting devices according to the first and second exemplary embodiments.

FIG. 8 is a graph depicting electrical properties of the light emitting devices according to the first and second embodiments of the invention.

As shown in FIG. 8, at the same electric current, the light emitting device according to the second embodiment has a lower voltage that the light emitting device according to the first embodiment. This result shows that, in the light emitting device according to the second embodiment, surface resistance of the first electrode pad 170 and the first conductive type semiconductor layer 130 is lower than that in the light emitting device according to the first embodiment.

As compared with the light emitting device according to the first embodiment, the light emitting device according to the second embodiment requires low operation voltage at the same electric current, thereby exhibiting excellent electrical properties.

In other words, as compared with the light emitting device according to the first embodiment, the light emitting device according to the second embodiment includes the first electrode pad 170 formed on the flat surface 130a and thus reduces surface resistance and heat generation due to creation of cavities at an interface between layers and due to a rough interface, thereby improving electrical properties and reliability.

Figure 9:
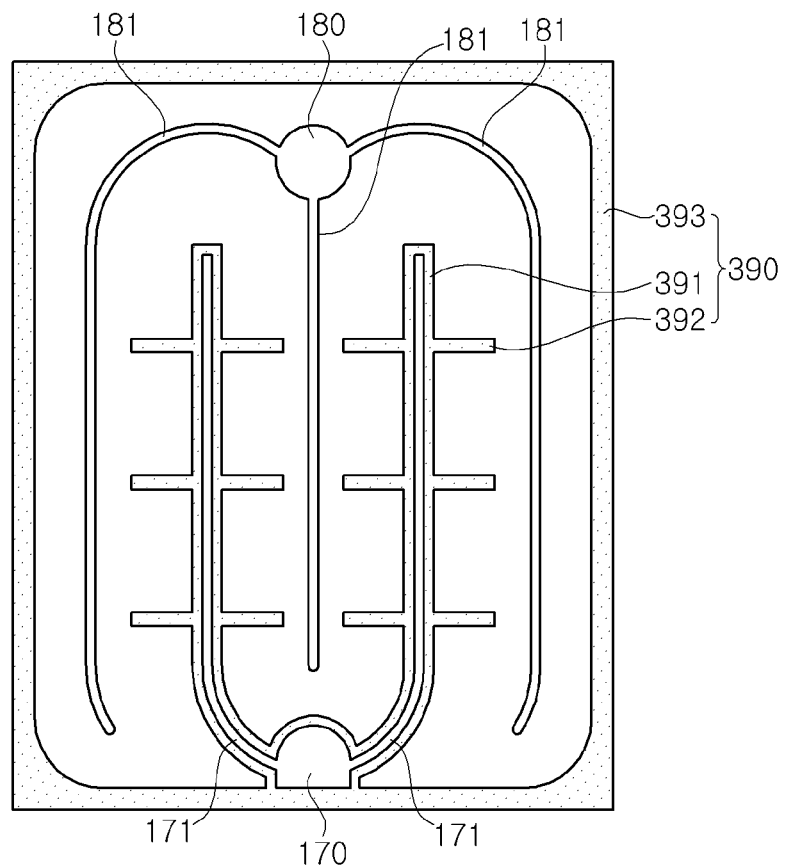
FIG. 9 is a schematic plan view of a light emitting device according to a third exemplary embodiment of the present invention.

FIG. 9 is a schematic plan view of a light emitting device according to a third embodiment of the invention.

Referring to FIG. 9, the light emitting device according to the third embodiment includes the same components as those of the light emitting devices according to the first embodiment except for a location of an irregular convex-concave pattern 390. Thus, the same components will be denoted by the same reference numerals, and detailed descriptions thereof will be omitted except for the irregular convex-concave pattern 390.

The irregular convex-concave pattern 390 includes a first irregular convex-concave pattern 391 overlapping the first electrode legs 171 to be parallel thereto, a second irregular convex-concave pattern 392 extending from the first irregular convex-concave pattern 391 towards second electrode legs 181, and a third irregular convex-concave pattern 393 formed in an edge region of the light emitting device.

In this embodiment, the first and second electrode legs 171, 181 are alternately formed to be parallel to each other in a first direction, and the second irregular convex-concave pattern 392 extends from the first and second electrode legs 171, 181 in a second direction perpendicular to the first direction in plan view.

The second irregular convex-concave pattern 392 includes plural concave portions and convex portions between the first and second electrode legs 171, 181, thereby maximizing light extraction efficiency.

In the light emitting device according to the third embodiment, the second irregular convex-concave pattern 392 is formed in a perpendicular direction with respect to the first irregular convex-concave pattern 391 parallel to the first electrode legs 171 in plan view, thereby further improving light extraction efficiency.

Figure 10:
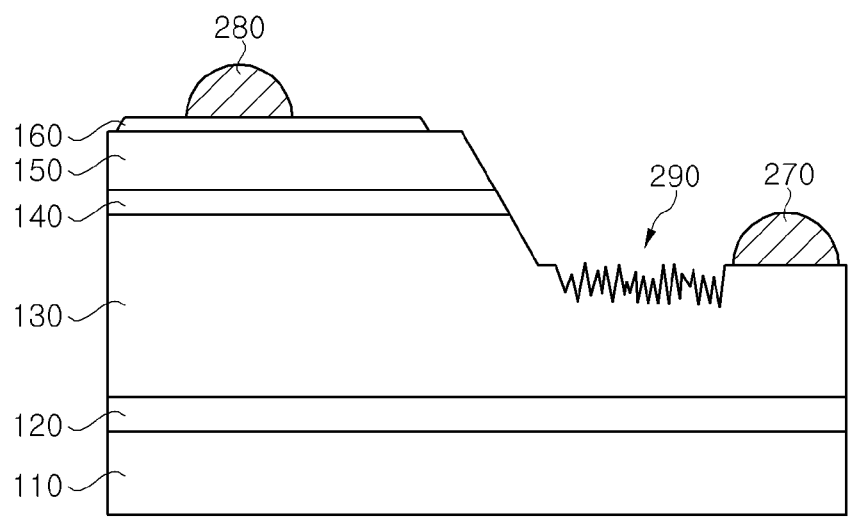
FIG. 10 is a schematic plan view of a light emitting device according to a fourth exemplary embodiment of the present invention.

FIG. 10 is a schematic plan view of a light emitting device according to a fourth embodiment of the invention.

Referring to FIG. 10, the light emitting device according to the fourth embodiment includes the same components as those of the light emitting devices according to the second embodiment except for first and second electrode pads 270, 280. Thus, the same components will be denoted by the same reference numerals, and detailed descriptions thereof will be omitted except for the first and second electrode pads 270, 280.

Each of the first and second electrode pads 270, 280 has a dome structure.

The dome structures of the first and second electrode pads 270, 280 minimizes reflection of light traveling towards an outside of the mesa area by the electrode pads 270, 280, and thus can minimize optical loss due to reflection of light into the semiconductor layers by the electrode pads 270, 280. As a result, the light emitting device according to this embodiment has further improved light extraction efficiency.

Although the invention has been illustrated with reference to some exemplary embodiments in conjunction with the drawings, it will be apparent to those skilled in the art that various modifications and changes can be made to the invention without departing from the spirit and scope of the invention. Further, it should be understood that some features of a certain embodiment may also be applied to other embodiments without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

What is claimed is:

1. A light-emitting device, comprising:
 a first conductivity-type semiconductor layer disposed on a substrate;
 an active layer disposed on the first conductivity-type semiconductor layer;
 a second conductivity-type semiconductor layer disposed on the active layer;
 an irregular convex-concave pattern disposed on a surface of the first conductivity-type semiconductor layer; and
 a first electrode pad,
 wherein the irregular convex-concave pattern comprises convex portions and concave portions, the convex portions comprising irregular heights, the concave portions comprising irregular depths,
 wherein the first conductivity-type semiconductor layer comprising the irregular convex-concave pattern is exposed from the active layer and the second conductivity-type semiconductor layer,
 wherein the irregular convex-concave pattern is disposed between the first electrode pad and the second conductivity-type semiconductor layer,
 wherein the first conductivity-type semiconductor layer comprises first, second, and third N-GaN layers, the first and third N-GaN layers being doped with a higher density of n-type impurities than the second N-GaN layer, and
 wherein a first part of the concave portions of the irregular convex-concave pattern extend to a portion of the second N-GaN layer or over an entire region of the second N-GaN layer, or extend to an upper region of the first N-GaN layer.

2. The light-emitting device of claim 1, wherein the third N-GaN layer is in ohmic contact with the first electrode pad, and the irregular convex-concave pattern is disposed on the third N-GaN layer.

3. The light-emitting device of claim 1, wherein the irregular convex-concave pattern is disposed below the active layer.

4. The light-emitting device of claim 1, further comprising:
 a first electrode pad disposed on the exposed surface of the first conductivity-type semiconductor layer; and
 first electrode legs extending from the first electrode pad,
 wherein the irregular convex-concave pattern is disposed under the first electrode pad and under the first electrode legs.

5. The light-emitting device of claim 1, further comprising:
 a first electrode pad disposed on the exposed surface of the first conductivity-type semiconductor layer,
 wherein an upper portion of the first conductivity-type semiconductor layer contacting the first electrode pad comprises a flat surface.

6. The light-emitting device of claim 5, wherein each of the convex portions of the irregular convex-concave pattern comprises a first end disposed coplanar with the flat surface or below the flat surface.

7. The light-emitting device of claim 5, wherein each of the convex portions of the irregular convex-concave pattern comprises a first end disposed coplanar with the flat surface or above the flat surface.

8. The light-emitting device of claim 5, further comprising:
 a second electrode pad disposed on the second conductivity-type semiconductor layer; and
 a transparent conductive layer disposed between the second conductivity-type semiconductor layer and the second electrode pad,
 wherein a lateral distance between the first electrode pad and the transparent conductive layer is in a range from 5 μm to 50 μm.

9. The light-emitting device of claim 5, further comprising:
 first electrode legs extending from the first electrode pad;
 a second electrode pad disposed on the second conductivity-type semiconductor layer; and
 second electrode legs extending from the second electrode pad and alternating with the first electrode legs to be disposed parallel to the first electrode legs,
 wherein the irregular convex-concave pattern comprises a first irregular convex-concave pattern overlapping the first electrode legs to be disposed parallel thereto, a second irregular convex-concave pattern extending from the first irregular convex-concave pattern towards the second electrode legs, and a third irregular convex-concave pattern disposed in an edge region of the light-emitting device.

10. The light-emitting device according to claim 5, further comprising:
 a second electrode pad disposed on the second conductivity-type semiconductor layer, the first and second electrode pads comprising a dome structure.

11. The light-emitting device of claim 1, wherein the first conductivity-type semiconductor layer is exposed along an edge region of the light-emitting device, and the irregular convex-concave pattern is disposed on the exposed surface of the first conductivity-type semiconductor layer along the edge region.

12. The light-emitting device of claim 11, wherein the edge region comprises a corner region and a lateral region, the corner region comprising a greater width than the lateral region.

13. The light-emitting device of claim 1, wherein the irregular convex-concave pattern in the first conductivity-type semiconductor layer comprises a height lower than that of the first conductivity-type semiconductor layer under the irregular convex-concave pattern.

14. The light-emitting device of claim 1, wherein the irregular convex-concave pattern comprises a height in a range from 160 nm to 3 μm.

* * * * *